(12) United States Patent
Brand et al.

(10) Patent No.: US 8,999,829 B2
(45) Date of Patent: Apr. 7, 2015

(54) DUAL GATE PROCESS

(71) Applicant: Applied Materials, Inc., Santa Clara, CA (US)

(72) Inventors: Adam Brand, Palo Alto, CA (US); Bingxi Wood, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 70 days.

(21) Appl. No.: 14/016,865

(22) Filed: Sep. 3, 2013

(65) Prior Publication Data

US 2014/0113442 A1  Apr. 24, 2014

Related U.S. Application Data

(60) Provisional application No. 61/716,134, filed on Oct. 19, 2012.

(51) Int. Cl.
*H01L 21/3205* (2006.01)
*H01L 29/76* (2006.01)
*H01L 29/49* (2006.01)

(52) U.S. Cl.
CPC ..................... *H01L 29/49* (2013.01)

(58) Field of Classification Search
CPC ............ H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66
USPC ........... 257/20, 194, 135–136, 213–413, 900, 257/902–903, E21.576, E21.585, E21.337, 257/E21.345, E29.066, E29.118, E29.136, 257/E21.634, E21.638, E21.639, E27.016, 257/E21.66, E21.682, E21.688, E27.103; 438/424, 427, 428, 591
See application file for complete search history.

(56) References Cited

U.S. PATENT DOCUMENTS 6,262,455 B1 * 7/2001 Lutze et al. ................... 257/369

* cited by examiner

*Primary Examiner* — Chuong A Luu
*Assistant Examiner* — Moin Rahman
(74) *Attorney, Agent, or Firm* — Kilpatrick Townsend & Stockton LLP

(57) ABSTRACT

The control of gate widths is improved for system-on-a-chip (SoC) devices which require multiple gate dielectric "gate" thicknesses, e.g., for analog and digital processing on the same chip. A hard mask is formed to protect a thick gate while the thin gate region is etched to remove oxide (sometimes referred to as a preclean step). The patterned substrate is then processed to selectively deposit a second thickness of gate material. The thin gate may be silicon oxide and the physical thickness of the thin gate may be less than that of the thick gate. In a preferred embodiment, the substrate is not exposed to air or atmosphere after the hardmask is removed.

17 Claims, 3 Drawing Sheets

DUAL GATE PROCESS

CROSS-REFERENCES TO RELATED APPLICATIONS

This application claims the benefit of U.S. Prov. Pat. App. No. 61/716,134 filed Oct. 19, 2012, and titled "DUAL GATE PROCESS" by Brand et al., which is hereby incorporated herein in its entirety by reference for all purposes.

FIELD

The present invention relates to semiconductor processing.

BACKGROUND OF THE INVENTION

There is a growing desire for a "system on a chip" as integrated circuit technology enters the ultra large scale integration (ULSI) era. Ideally, the industry would like to build a computing system by fabricating all the necessary integrated circuits on one substrate, as compared to fabricating many chips of different functions on multiple substrates. The concept of "system on a chip" has been around since the very large scale integration (VLSI) era (early 1980s), but even today, it is very difficult to implement such a truly high-performance system on a single chip because of vastly different fabrication processes and different manufacturing yields for various I/O, logic and memory circuits.

In CMOS logic used for manufacturing system-on-a-chip (SOC) products there are usually gates of differing thicknesses, for example, a SOC may have a thin silicon oxide gate and a thick oxide gate. The thin gate is used for high performing devices since it facilitates faster switching. The thicker gate is used for analog, I/O, voltage regulation and other applications requiring higher voltage than the thin gate can tolerate. In more complex devices, there may even be more than two gate oxide thicknesses in a CMOS technology.

There is a need for new manufacturing processes which enable more control of thin gate oxide thickness on SOC devices.

BRIEF SUMMARY OF THE INVENTION

The control of gate widths is improved for system-on-a-chip (SoC) devices which require multiple gate dielectric "gate" thicknesses, e.g., for analog and digital processing on the same chip. A hard mask is formed to protect a thick gate while the thin gate region is etched to remove oxide (sometimes referred to as a preclean step). The patterned substrate is then processed to selectively deposit a second thickness of gate material. The thin gate may be silicon oxide and the physical thickness of the thin gate may be less than that of the thick gate. In a preferred embodiment, the substrate is not exposed to air or atmosphere after the hardmask is removed.

Embodiments of the invention include a method of forming two gates of differing thicknesses on a patterned substrate. The method includes the sequential steps of (a) providing a patterned substrate having a patterned silicon-and-nitrogen-containing layer over a patterned thick gate dielectric layer formed over a semiconductor material. The patterned substrate comprises a first trench and a second trench which each have a first thickness of thick gate dielectric material of the patterned thick gate dielectric layer. The method further includes a sequential step (b) of forming a conformal hardmask layer over the patterned substrate. The method further includes a sequential step (c) of forming a photoresist layer over the patterned substrate. The method further includes a sequential step (d) patterning the conformal hardmask layer and the photoresist layer to expose the thick gate dielectric layer in the second trench but leaving the thick gate dielectric layer in the first trench protected. The method further includes a sequential step (e) of etching the thick gate dielectric material from the second trench to expose the semiconductor material. The method further includes a pair of steps (f) of forming a thin gate dielectric layer on the exposed semiconductor material and removing the remaining conformal hardmask layer by exposing the remaining conformal hard mask layer to a plasma. The pair of steps may be carried out in either order so the first step in (f) may occur before the second or vice versa. The thin gate dielectric layer has a second thickness, different from the first thickness.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the invention may be realized by reference to the remaining portions of the specification and the drawings, presented below. The Figures are incorporated into the detailed description portion of the invention.

Figure 1A:
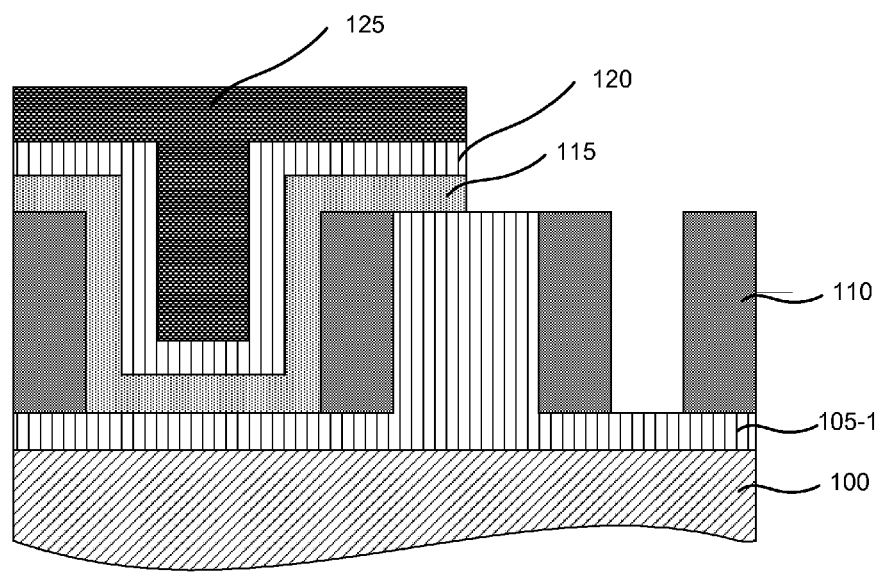
FIGS. 1A-1C illustrate cross-sectional views representing a dual gate processing sequence according to embodiments of the invention.
Figure 1B:
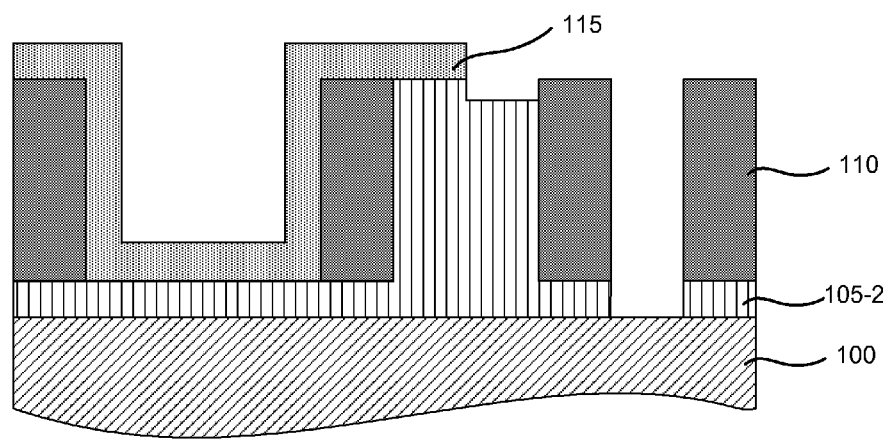
Figure 1C:
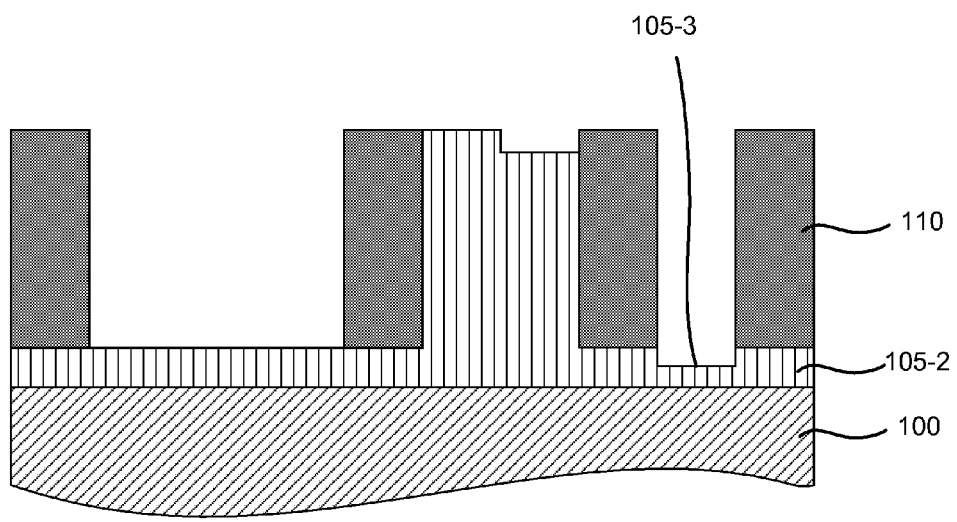

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The control of gate widths is improved for system-on-a-chip (SoC) devices which require multiple gate dielectric "gate" thicknesses, e.g., for analog and digital processing on the same chip. A hard mask is formed to protect a thick gate while the thin gate region is etched to remove oxide (sometimes referred to as a preclean step). The patterned substrate is then processed to selectively deposit a second thickness of gate material. The thin gate may be silicon oxide and the physical thickness of the thin gate may be less than that of the thick gate. In a preferred embodiment, the substrate is not exposed to air or atmosphere after the hardmask is removed.

An exemplary process which does not use the techniques taught and claimed herein will now be described to contrast with the present invention. The exemplary process may involve (1) precleaning space for the thick gate effected by either a wet HF exposure or a dry etch (2) oxidizing to form the thick silicon oxide gate, (3) photo-patterning the thick gate oxide, (4) wet or dry etching of the thick gate oxide with photoresist still on the wafer, (5) removing the photoresist (dry ozone, sulfuric acid, SC1 and/or SC2 wet cleans), (6) precleaning the space for the thin gate, and (7) oxidizing to form the thin silicon oxide gate. A high-k deposition may then follow step 7, if desired, to increase performance characteristics. When a high-k material is deposited over the thick silicon oxide gate and/or the thin silicon oxide gate, the thick silicon oxide gate and the thin silicon oxide gates may are typically also referred to as interface layers (IL's). Interface layers will be referred to herein as gates or portions thereof.

The preclean of step 6 is necessary to prepare for growth of the extremely thin silicon oxide gate. Unfortunately, step 6 also affects the thickness of the thick gate applied during step 2. Hypothetically, precise control of the preclean would allow the removal amount to be predicted and compensated for in some cases. Such precise control is generally not possible and in any event would place undesirably precise process constraints on step 6. The combined process represented in steps (1)-(7) can result in wafer-to-wafer and across wafer nonuniformity problems. Quantitatively, the preclean applied prior to formation of the thin gate may involve removing 20 Å to 30 Å of oxide and may remove even more of the thick gate when overetch is factored in. Since the thick gate is also exposed at this point, the thick gate oxide area is undesirably and, as it turns out, unnecessarily thinned. Another potential problem is that any STI oxide is partly removed each time the thick gate is exposed to another thin gate preclean. This becomes a particular problem when multiple gate passes are conducted. An object of the present invention is to avoid processing the thick gate oxide during the precleaning step (6) needed before forming the thin gate.

The present invention provides protection for the thick gate oxide by invoking a removable hardmask to protect the thick gate dielectric, and to remove the hardmask in a tool cluster where hardmask removal is done after thin gate preclean, and before the thin gate oxidation. In a preferred embodiment, the substrate is not exposed to air or atmosphere between the preclean of the site for the thin silicon oxide gate and oxidation to actually form the thin silicon oxide gate. The site is unprotected during this period of time. Such an airbreak may necessitate an additional preclean and compromise the benefits of the present invention.

In order to better understand and appreciate the invention, reference is now made to FIGS. 1A-1C and FIG. 2 which are depict cross-sectional views during and process steps according to a dual gate processing sequence according to embodiments of the invention. A substrate 100 is provided having a patterned silicon nitride layer 110 formed over a patterned silicon oxide layer 105-1 formed over substrate 100. The thin regions of silicon oxide 105-1 may have a thickness near a desired thick gate oxide thickness.

Figure 2:
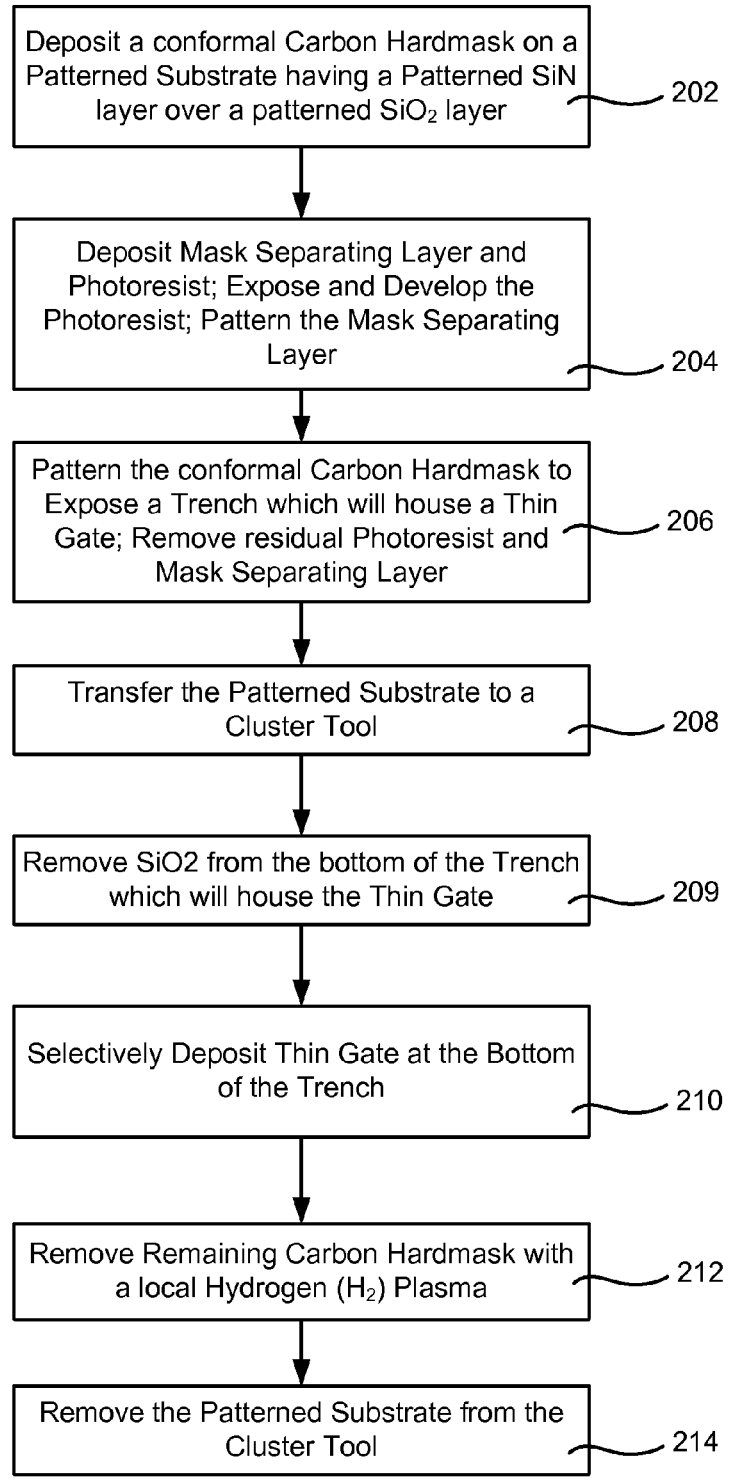
FIG. 2 is a flowchart depicting steps associated with a dual gate processing sequence according to embodiments of the invention.

A conformal carbon hardmask 115 is deposited over the patterned silicon nitride layer 110 and the patterned silicon oxide layer 105-1 (step 202 of FIG. 2). The hardmask is conformal, in embodiments, to facilitate the production of FinFET transistors as well as other non-planar circuit elements. An exemplary hardmask is Topaz conformal carbon layer available from Applied Materials, Santa Clara, Calif. Such hardmask layers may consist only of carbon which allows for small concentration of sparse or unavoidable non-carbon components. Hardmask 115 is topped with silicon oxide 120 which serves as a mask separation layer and the stack may be patterned using photoresist 125 (step 204). The hardmask 115 is patterned (step 206) using the photoresist layer 125 as a mask to expose a trench which will eventually house a thin gate. Residual photoresist and the mask separating layer are removed in disclosed embodiments.

The patterned substrate is then transferred into a cluster tool (step 208) for sequential processing without breaking vacuum. A portion of the patterned silicon oxide layer is removed (step 209) to expose underlying semiconductor substrate material (e.g. silicon). Note that only a portion or remnants of silicon oxide may be removed at this point, since the bulk of the etch may occur outside the cluster tool in disclosed embodiments. In these cases, the silicon oxide removal is referred to as a preclean, and may be a precise and selective removal process. One such process (e.g. Siconi available from Applied Materials) involves exciting $NF_3$ and $NH_3$ remotely and flowing the effluents into a substrate processing region to form solid residue from exposed silicon oxide. The solid residue is then sublimated from the surface into the gas phase and removed from the processing region, perhaps, through the chamber exhaust.

The thin gate is selectively formed at the bottom of the precleaned trenches, e.g., by exposing the substrate to oxygen at elevated temperature (step 210). The hardmask is then removed with a local hydrogen plasma (step 212). The local hydrogen plasma may be devoid of oxygen in order to retain the precise thickness and properties of the thin oxide gate. The patterned substrate may then be removed from the cluster tool in step 214. It should be noted that step 212 can occur after step 210 as shown or the order may be inverted so step 212 occurs before 210, in disclosed embodiments. The remainder of the steps described herein must be carried out in the order specified.

The importance of avoiding uncontrolled physical modification of the gates between several steps warrants some additional discussion and clarification. In embodiments of the invention, a gate cluster tool is used which has the ability to (a1) selectively remove residual silicon oxide, (a2) form the thin gate and (a3) remove the hardmask material without intermediate exposure of the substrate to the oxygen or the atmosphere surrounding the cluster tool. No exposure to oxygen or the atmosphere occurs between the steps a1-a2 and/or steps a2-a3 in embodiments of the invention. As indicated previously, step 212 may also occur before 210, so the following analogous processing orders are also possible as an alternative. In further embodiments of the invention, a gate cluster tool is used which has the ability to (b1) selectively remove residual silicon oxide, (b2) remove the hardmask material and (b3) form the thin gate without intermediate exposure of the substrate to the oxygen or the atmosphere surrounding the cluster tool. No exposure to oxygen or the atmosphere occurs between the steps b1-b2 and/or steps b2-b3 in embodiments of the invention.

The process flow just described may be applied multiple times to form more than two thicknesses of dielectric gates. Multiple iterations of this dual-gate process can be carried out because the thick gate areas are not sequentially degraded. The process sequence has additional benefits. Since little or no material is removed from the thick gate oxide, a thinner thick gate oxide can be deposited. A thinner thick gate makes it more feasible that the thin gate oxide can reuse an existing layer such as the dummy gate oxide which can be a high quality thermal oxide. The process flow also improves feasibility of using a high quality thermal oxide on a FinFET technology since less oxidation is necessary.

In order to prevent undesirable additional oxidation (and thickening) of the thin gate oxide, the hardmask may be removed by a plasma which has no or essentially no oxygen content. The inventors have found, that some conformal carbon films are removable by a hydrogen ($H_2$)-only plasma, enabling the claimed process flow. A hydrogen plasma does not affect the delicate thin silicon oxide layer (or other higher K dielectric gate materials) and is therefore very compatible with the process flow described herein. The plasma may be formed by striking a plasma in the substrate processing while simultaneously flowing hydrogen (H$_2$) into the substrate processing region. This type of processing has been found to remove conformal carbon hardmask layers such as Topaz, from Applied Materials. The inventors have quantified the hydrogen (H$_2$) plasma etch selectivity and found it to be in excess of 200:1 (Topaz:SiO$_2$), greater than 500:1 or greater than 800:1 in embodiments of the invention. Beyond hydrogen, the hydrogen (H$_2$) plasma may contain only inert components, such as He and Ar, in disclosed embodiments, without deviating from the scope of a hydrogen-only plasma as described and claimed herein.

More generally, the mask separating layer may be a material other than silicon oxide. The hardmask and photoresist (softmask) may both be carbon-based, in which case the mask separating layer would preferably be a dielectric material which etches by a different mechanism. In an embodiment, both the hardmask and photoresist are predominantly carbon (the hardmask may consist only of carbon, in embodiments). As such, plasma treatments designed for carbon films may be used to remove either the hardmask or the softmask but will spare a mask separating layer such as silicon oxide, silicon nitride, silicon oxynitride or any dielectric having carbon concentration below a threshold level. In embodiments, the softmask may be ashed with ozone (O$_3$) whereas the hardmask is removed with a hydrogen (H$_2$) plasma due to the sensitive surfaces exposed at that stage of the process.

As indicated previously, the hardmask layer may be characterized as conformal and may comprise carbon or consist only of carbon in embodiments. The conformal hardmask layer may also comprise carbon as well as significant concentrations of other elements such as hydrogen. Conformality is somewhat flexibile, for example, the thickness at the bottom of a trench may be higher (or lower) than the thickness at the top due to vagaries of a given deposition method. Hypothetically, flowable deposition of the hardmask would be undesirable because removing the gapfill hardmask could result in damage to the trench top surfaces or the exposed region on which the thin gate will be formed. Damage may occur as a result of the sustained overetch necessary to remove the gapfill hardmask portion.

Generally speaking, the gate materials may be a variety of nitride or oxide films. This process can be used for the interface layer in a HiK stack, or in an oxide only gate stack. Some oxide films may have a higher dielectric constant than silicon oxide and can still benefit from the processes outlined herein. The thick gate dielectric layer and the thick gate formed from the layer may be an oxide film having a dielectric constant greater than that of silicon oxide in disclosed embodiments. Similarly, the thin gate dielectric layer and the thin gate formed from the layer may be an oxide film having a dielectric constant greater than that of silicon oxide. In disclosed embodiments, of course, the thick gate dielectric layer, the thick gate, the thin gate dielectric layer and/or the thin gate are silicon oxide.

The thin gate may be a different material than the thick gate and therefore the thickness of the "thin" gate may actually be greater than that of the "thick" gate especially when the dielectric constant of the material forming the thin gate is much higher than the dielectric constant of the thick gate. However, both the thin gate and the thick gate may simply be silicon oxide, in which case the thin gate will be thinner than the thick gate. The thin gate may also refer to the interface layer, when present, prior to the deposition of a much higher dielectric constant material. In such cases, the thin gate is typically thermally grown by exposing the semiconductor substrate (silicon) to oxygen at elevated temperature.

The thin gates described herein may be below or about 20 Å (for example between about 1 Å and about 20 Å) or may be below or about 10 Å (for example between about 1 Å and about 10 Å) in embodiments of the invention. The thick gates as described herein may be thicker than the thin gates by a differential thickness of about 1 Å, 2 Å, 5 Å, or 10 Å in disclosed embodiments. The thick gates may be thicker than the thin gates by a factor of about two, three or four in embodiments. The thick gates described herein may be greater than or about 10 Å (for example between about 10 Å and about 100 Å), between about 10 Å and about 80 Å or between about 20 Å and about 70 Å in embodiments of the invention.

In the example provided in FIGS. 1-2, a patterned silicon nitride layer and a patterned silicon oxide layer were present on the provided patterned substrate. The choice of materials is somewhat flexible. The silicon oxide layer may more generally be silicon oxide, silicon nitride or silicon oxynitride in disclosed embodiments. As such, the layer may be described herein as a thick gate dielectric layer since the thick gate is formed without further alteration from a portion of a thick region of the patterned thick gate dielectric layer. The patterned thick gate dielectric layer may include little or no carbon in embodiments of the invention. The patterned silicon nitride layer may more generally be silicon nitride, silicon carbon nitride, silicon oxynitride, or silicon carbon oxynitride in disclosed embodiments. Carbon concentration should be low so the patterned layer can withstand etching used to remove the hardmask layer. The patterned silicon nitride layer will generally be referred to as a silicon-and-nitrogen-containing layer.

Lastly, the motivational example of a system-on-a-chip may not be the only application to benefit from the diversity of tightly-controlled gate widths enabled by the present invention. Complementary metal oxide semiconductors (CMOS) provide another situation where two gates may benefit from having differing thicknesses. Normally, the gate on the nMOS device has a different effective thickness than the gate on the pMOS device. The techniques described and claimed herein may be used to compensate for the difference and improve the performance of the completed CMOS device.

The term "trench" is used throughout with no implication that the etched geometry has a large horizontal aspect ratio. Viewed from above the surface, trenches may appear circular, oval, polygonal, rectangular, or a variety of other shapes. The term "via" is used to refer to a low horizontal aspect ratio trench (as viewed from above) which may or may not be filled with metal to form a vertical electrical connection. As used herein, a conformal layer refers to a generally uniform layer of material on a surface in the same shape as the surface, i.e., the surface of the layer and the surface being covered are generally parallel. A person having ordinary skill in the art will recognize that the deposited material likely cannot be 100% conformal and thus the term "generally" allows for acceptable tolerances.

What is claimed is:
1. A method of forming two gates on a patterned substrate, the method comprising the sequential steps of:
   (a) providing a patterned substrate having a patterned silicon-and-nitrogen-containing layer over a patterned thick gate dielectric layer formed over a semiconductor material, wherein the patterned substrate comprises a first trench and a second trench which each have a first thickness of thick gate dielectric material of the patterned thick gate dielectric layer;
(b) forming a conformal hardmask layer over the patterned substrate;
(c) forming a photoresist layer over the patterned substrate;
(d) patterning the conformal hardmask layer and the photoresist layer to expose the thick gate dielectric layer in the second trench but leaving the thick gate dielectric layer in the first trench protected;
(e) etching the thick gate dielectric material from the second trench to expose the semiconductor material;
(f) removing the remaining conformal hardmask layer by exposing the remaining conformal hard mask layer to a plasma; and forming a thin gate dielectric layer on the exposed semiconductor material, wherein the thin gate dielectric layer has a second thickness, different from the first thickness.

2. The method of claim 1 wherein removing the remaining conformal hardmask layer occurs before forming the thin gate dielectric layer.

3. The method of claim 1 wherein removing the remaining conformal hardmask layer occurs after forming the thin gate dielectric layer.

4. The method of claim 1 wherein forming the thick gate dielectric layer and removing the remaining conformal hardmask layer occur without an intervening exposure to the atmosphere.

5. The method of claim 1 wherein etching the thick gate dielectric material from the second trench and removing the remaining conformal hardmask layer occur without an intervening exposure to the atmosphere.

6. The method of claim 1 wherein the second thickness is less than the first thickness.

7. The method of claim 1 wherein the second thickness is less than the first thickness by at least 1 Å.

8. The method of claim 1 wherein the second thickness is less than the first thickness by at least 5 Å.

9. The method of claim 1 wherein the first thickness is at least twice the second thickness.

10. The method of claim 1 wherein the first thickness is less than the second thickness.

11. The method of claim 1 wherein the thick gate dielectric layer is an oxide film having a dielectric constant greater than that of silicon oxide.

12. The method of claim 1 wherein the thin gate dielectric layer is an oxide film having a dielectric constant greater than that of silicon oxide.

13. The method of claim 1 wherein the thick gate dielectric layer is silicon oxide.

14. The method of claim 1 wherein the thin gate dielectric layer is silicon oxide.

15. The method of claim 1 wherein conformal hardmask layer consists only of carbon.

16. The method of claim 1 wherein the plasma is a local plasma formed by flowing hydrogen ($H_2$) into a substrate processing region housing the patterned substrate while applying plasma power to the region.

17. The method of claim 1 wherein the patterned silicon-and-nitrogen-containing layer is one of silicon nitride, silicon oxynitride, silicon carbon nitride or Si—O—C—N.

* * * * *